United States Patent
Uno et al.

(10) Patent No.: US 12,251,738 B2
(45) Date of Patent: Mar. 18, 2025

(54) METHOD AND APPARATUS FOR CLEANING WASHING TOOL, SUBSTRATE WASHING DEVICE, AND METHOD FOR MANUFACTURING WASHING TOOL

(71) Applicant: EBARA CORPORATION, Tokyo (JP)

(72) Inventors: Megumi Uno, Tokyo (JP); Akira Fukunaga, Tokyo (JP); Chikako Takatoh, Tokyo (JP); Yumiko Nakamura, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 18/041,579

(22) PCT Filed: Jul. 28, 2021

(86) PCT No.: PCT/JP2021/027819
§ 371 (c)(1),
(2) Date: Feb. 14, 2023

(87) PCT Pub. No.: WO2022/038978
PCT Pub. Date: Feb. 24, 2022

(65) Prior Publication Data
US 2024/0024928 A1    Jan. 25, 2024

(30) Foreign Application Priority Data
Aug. 19, 2020   (JP) .................................. 2020-138511

(51) Int. Cl.
*B08B 13/00*    (2006.01)
*B08B 1/14*    (2024.01)
(Continued)

(52) U.S. Cl.
CPC ................ *B08B 3/08* (2013.01); *B08B 1/145* (2024.01); *B08B 1/32* (2024.01); *B08B 13/00* (2013.01)

(58) Field of Classification Search
None
See application file for complete search history.

(56) References Cited

U.S. PATENT DOCUMENTS

| 2011/0265279 A1 | 11/2011 | Kawaguchi et al. |
| 2020/0066549 A1 | 2/2020 | Ishibashi |
| 2021/0039142 A1 | 2/2021 | Takatoh et al. |

FOREIGN PATENT DOCUMENTS

| JP | H0631214 A  * | 2/1994 |
| JP | H10-060150 A | 3/1998 |

(Continued)

OTHER PUBLICATIONS

Google Patents translation of JPH0631214A (Year: 2024).*

(Continued)

*Primary Examiner* — Eric W Golightly
(74) *Attorney, Agent, or Firm* — Chrisman Gallo Tochtrop LLC

(57) ABSTRACT

A cleaning apparatus performing cleaning treatment for a washing tool used for substrate washing by causing the washing tool to contact with a cleaning member while supplying a washing liquid to the washing tool includes a liquid extraction unit that extracts the washing liquid remaining in the washing tool or the washing liquid flowing out from the washing tool in the cleaning treatment, a color reaction unit that applies an iodine color reaction to the washing liquid extracted by the liquid extraction unit, and a determination unit that detects a coloration degree of the washing liquid subjected to the iodine color reaction and determines whether or not cleaning of the washing tool is completed based on the detected coloration degree.

7 Claims, 13 Drawing Sheets

(51) Int. Cl.
   *B08B 1/32*     (2024.01)
   *B08B 3/08*     (2006.01)

(56) References Cited

FOREIGN PATENT DOCUMENTS

| | | |
|---|---|---|
| JP | 2000-204190 A | 7/2000 |
| JP | 2016-057278 A | 4/2016 |
| JP | 2016-202106 A | 12/2016 |
| JP | 2019-095328 A | 6/2019 |
| JP | 2019-161107 A | 9/2019 |
| JP | 2020-027807 A | 2/2020 |
| JP | 2020-094083 A | 6/2020 |
| WO | 2010/001761 A1 | 1/2010 |

OTHER PUBLICATIONS

Google Patents translation of JP 2000-204190 (Year: 2024).*
Google Patents translation of JP 2016-057278 (Year: 2024).*
Google Patents translation of JP 2016-202106 (Year: 2024).*
Google Patents translation of JP 2019-095328 (Year: 2024).*
Google Patents translation of JP 2019-0161107 (Year: 2024).*
International Search Report issued in Patent Application No. PCT/JP2021/027819 dated Nov. 2, 2021, 6 pages.

* cited by examiner (A) Infrared Absorption Spectrum (Compared with Starch)

(B) Infrared Absorption Spectrum (Compared with PVA Sponge)

(A) Iodine Color Reaction of Starch (B) Iodine Color Reaction of Cross-Linked PVA (A) Washing by Pure Water (B) Washing by Heated Starch Degrading Enzyme Solution

METHOD AND APPARATUS FOR CLEANING WASHING TOOL, SUBSTRATE WASHING DEVICE, AND METHOD FOR MANUFACTURING WASHING TOOL

TECHNICAL FIELD

The present invention relates to a method and an apparatus for cleaning a washing tool used for washing a polished substrate and a method for manufacturing a washing tool.

BACKGROUND ART

One of methods for planarizing a surface of a substrate for semiconductor device formation is polishing by a chemical mechanical polishing (CMP) device. In CMP, a surface of a polishing target such as a substrate is pressed onto a polishing member, the polishing member and the polishing target are caused to perform relative motion while a polishing liquid is supplied to a portion between the polishing member and the polishing target, and the surface of the polishing target is thereby polished to be flat.

In general, a polishing device that polishes a substrate includes a substrate washing device that washes a polished substrate. Substrate washing is performed by causing a washing tool such as a roll sponge or a pen sponge to contact with a substrate while the polished substrate is rotated.

As a washing tool used for the substrate washing, a sponge formed of PVA (polyvinyl alcohol) is used while being set in a washing device, for example. Here, because cleanness for washing of a semiconductor device is much higher than cleanness required in a manufacturing process of the washing tool, the washing tool has to be cleaned before use in the substrate washing. Specifically, washing and rinsing treatment by using a combination with ultrapure water, an alkali-based chemical, an enzyme-based washing liquid or the others is performed. Cleaning of the washing tool is performed when the washing tool is replaced with a new washing tool (referred to as break-in) or at each predetermined number of washes of substrates.

Further, in a substrate washing device disclosed in Japanese Patent Laid-Open No. 2019-161107, when a washing tool is washed by causing the washing tool to contact with a cleaning member while the washing tool is rotated by a washing tool rotation mechanism, a torque at which the washing tool rotation mechanism rotates the washing tool is controlled and highly efficient cleaning of the washing tool is thereby performed in a short time period.

SUMMARY OF INVENTION

As described above, high degree of washing is demanded for a semiconductor device, and it is desired that the number of defects on a substrate with sizes of approximately several ten nanometers is several tens or less, for example. Thus, washing treatment is actually performed for a clean substrate by using a washing tool after cleaning treatment, a surface of the substrate is thereafter checked by a defect inspection device, and whether the washing tool can be used is thereby determined.

Here, because the defect inspection device itself is an expensive device, using the defect inspection device only for checking whether the washing tool can be used is not realistic, and it is usual to use a defect inspection device used for manufacturing of semiconductor devices. However, as an objective index for measuring an extent of cleanness of the washing tool by the cleaning treatment, no other index has been present than direct defect counting by the defect inspection device. In a case where a considerable number of defects remain as a result of an inspection by the defect inspection device on the substrate subjected to the washing treatment by the washing tool subjected to the cleaning treatment, it has been necessary to again apply the cleaning treatment for the washing tool and repeat a similar inspection. Thus, a method has been demanded that can reduce checks for the washing degree by the high-cost defect inspection device as much as possible.

The inventor of the present application has conducted intensive studies about types of defects that are transferred from a PVA brush as a washing tool to a substrate as a washing target and a detection method of defects. FIG. 1 illustrates measurement examples of infrared absorption spectra of a sample (a sample containing eluted substances from the PVA brush), which can be obtained by drying a liquid discharged when the PVA brush used as the washing tool is washed by pure water, (A) illustrates a case of a comparison with a spectrum of starch, and (B) illustrates a case of a comparison with a spectrum of a PVA sponge. From the spectra in FIG. 1, it has been found that starch and PVA are contained in the eluted substances from the PVA brush and adhesion of those eluted substances to the substrate in substrate washing can cause defects.

FIG. 2 illustrates graphs representing examples of spectra of absorbance that are obtained after iodine color reactions, (A) illustrates spectra with respect to starch, and (B) illustrates spectra with respect to PVA resulting from cross-linking of uncross-linked PVA by a cross-linking agent. From those graphs, it can be understood that as for starch and cross-linked PVA, respective peaks of absorbance occur in a wavelength range of 600 to 800 nm and the peaks become clearer as concentrations of starch and PVA become higher.

FIG. 3 illustrates measurement examples of absorbance distributions of eluted substances from the PVA brush that are obtained after the iodine color reactions and illustrates eluted substances in a case where a new PVA brush is washed by pure water and eluted substances obtained after washing and rinsing treatment (break-in (BI)) that is performed after installation in a brush washing device. As illustrated in FIG. 2, it has been found that, although starch and cross-linked PVA bond with iodine and are colored blue, around a wavelength of 670 nm corresponding to the blue color, the absorbance is lowered (that is, the blue color becomes lighter) by the break-in. Thus, it has been found that by monitoring a coloration degree (absorbance) of the iodine color reaction for the eluted substances from the brush, the degree of washing of the brush, that is, whether the brush is made clean to such a level that the brush can be used for the substrate washing can be detected and determined.

Further, FIG. 3 also illustrates a measurement result (dotted lines) of the absorbance in a case where a starch degrading enzyme is added to an eluted liquid, and this indicates that in a state where the brush is a new product (prior to the break-in), the absorbance is lowered by addition of the starch degrading enzyme and starch remains. On the other hand, FIG. 3 illustrates that in a state after the break-in, the absorbance is lowered in the whole range, the absorbance is not changed even by addition of the starch degrading enzyme, and starch is completely removed. Accordingly, when this evaluation method indicates that starch is removed and the considerable amount of PVA is removed, it can be determined that cleaning is achieved.

FIG. 4 illustrates results of observation of a sample from precipitates emitted by pressure washing in pure water at a room temperature, treated in heated pure water for 10 minutes to remove water-soluble PVA, and then dried. FIG. 4 (A) illustrates a case where the washing treatment is performed by heated pure water, and (B) illustrates a case where the washing treatment is performed by a heated starch degrading enzyme solution. Further, in (A) and (B) of FIG. 4, the left images are optical microscope dark field images, and the right images are optical microscope bright field images, that are obtained after the water-soluble PVA is removed. Those images indicate that a bright spot density of the sample is lower (that is, an amount of impurity in the eluted substances is smaller) in a case where the washing treatment is performed by the starch degrading enzyme solution, compared to a case where the washing treatment is performed by pure water.

In consideration of the above facts, one aspect of the present invention provides a cleaning apparatus performing cleaning treatment for a washing tool used for substrate washing by causing the washing tool to contact with a cleaning member while supplying a washing liquid to the washing tool, the cleaning apparatus including a liquid extraction unit that extracts the washing liquid remaining in the washing tool or the washing liquid flowing out from the washing tool in the cleaning treatment, a color reaction unit that applies an iodine color reaction to the washing liquid extracted by the liquid extraction unit, and a determination unit that detects a coloration degree of the washing liquid subjected to the iodine color reaction and determines whether or not cleaning of the washing tool is completed based on the detected coloration degree.

Another aspect of the present invention provides a method for cleaning a washing tool used for substrate washing, the method including a washing step of cleaning the washing tool by causing the washing tool to contact with a cleaning member while supplying a washing liquid to the washing tool, an extraction step of extracting the washing liquid remaining in the washing tool or the washing liquid flowing out from the washing tool in the washing step, a coloring step of applying an iodine color reaction to the washing liquid extracted in the extraction step, and a determination step of detecting a coloration degree of the washing liquid subjected to the iodine color reaction and determining whether or not cleaning of the washing tool is completed based on the detected coloration degree.

DESCRIPTION OF EMBODIMENTS

First Embodiment

Figure 1:
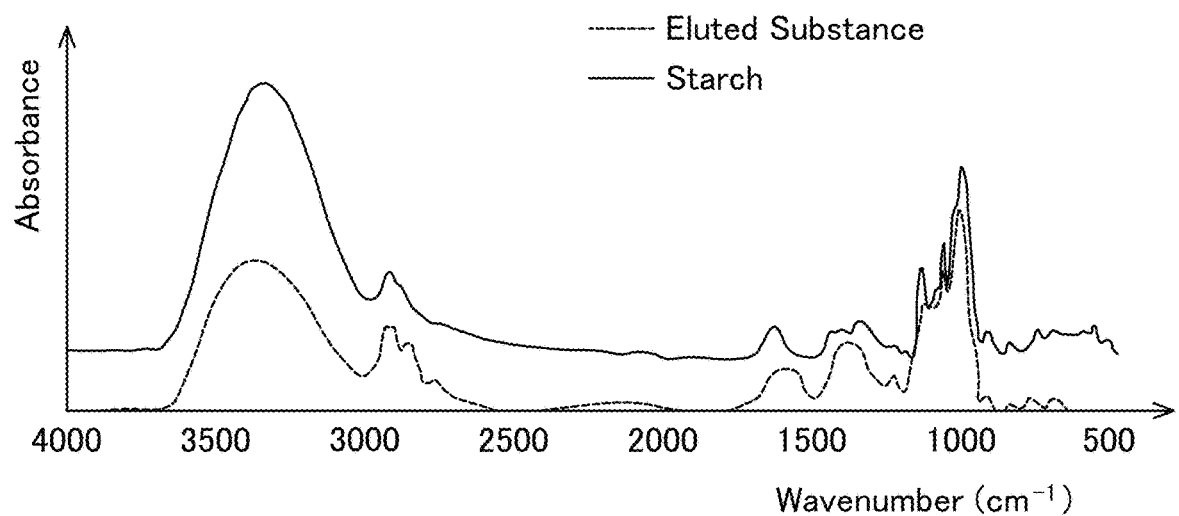
FIG. 1 illustrates graphs representing examples of infrared absorption spectra of eluted substances from a washing tool, in which (A) illustrates a case of a comparison with starch and (B) illustrates a case of a comparison with a PVA sponge.
Figure 1:
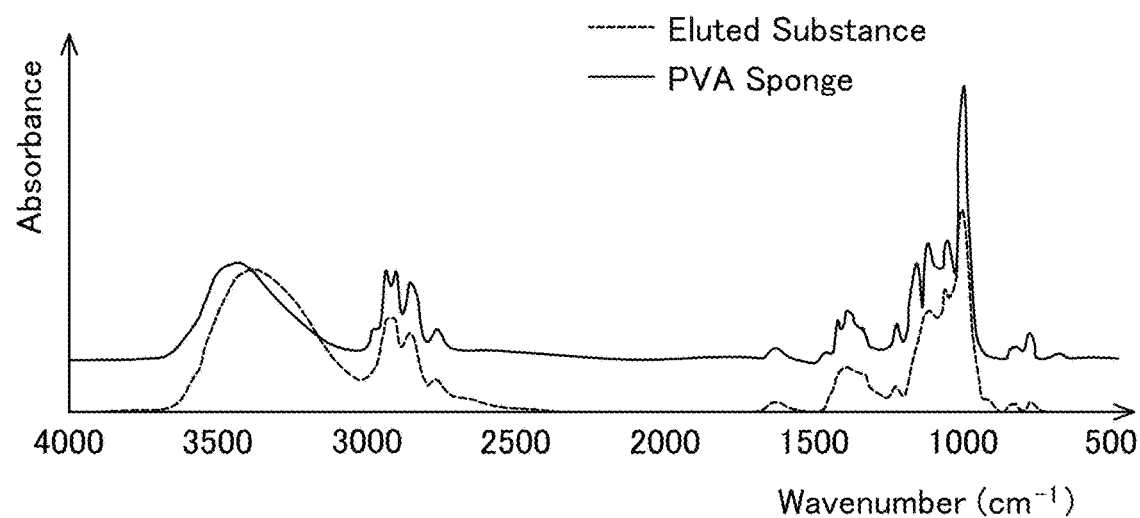
Figure 2:
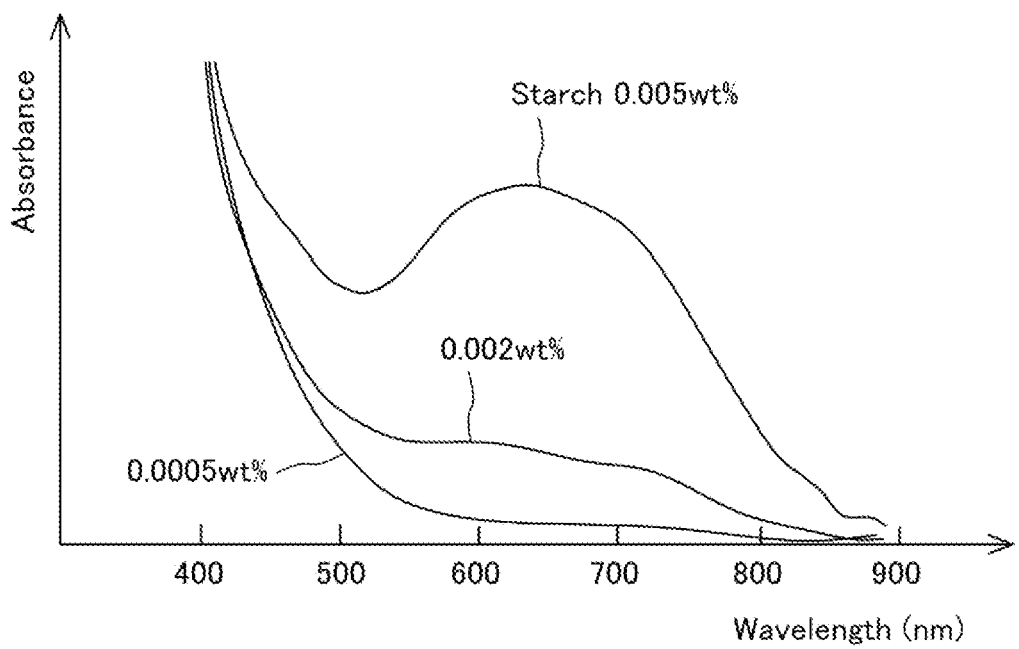
FIG. 2 illustrates graphs representing examples of absorbance, in which (A) illustrates examples of an iodine color reaction with respect to starch and (B) illustrates examples of an iodine color reaction with respect to PVA to which cross-linking is applied.
Figure 2:
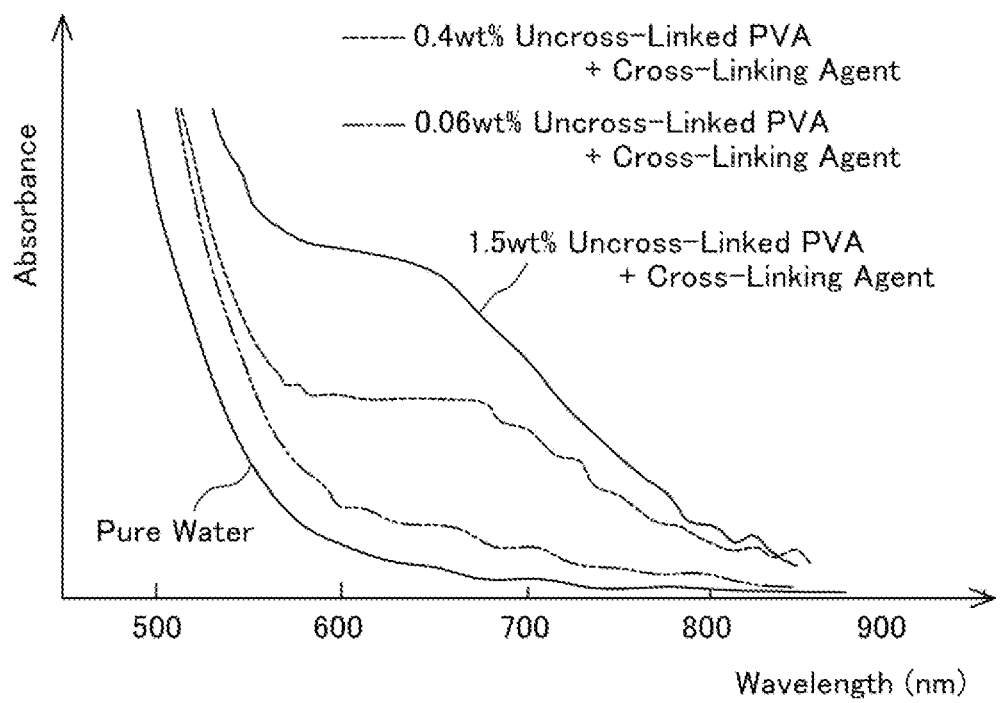
Figure 3:
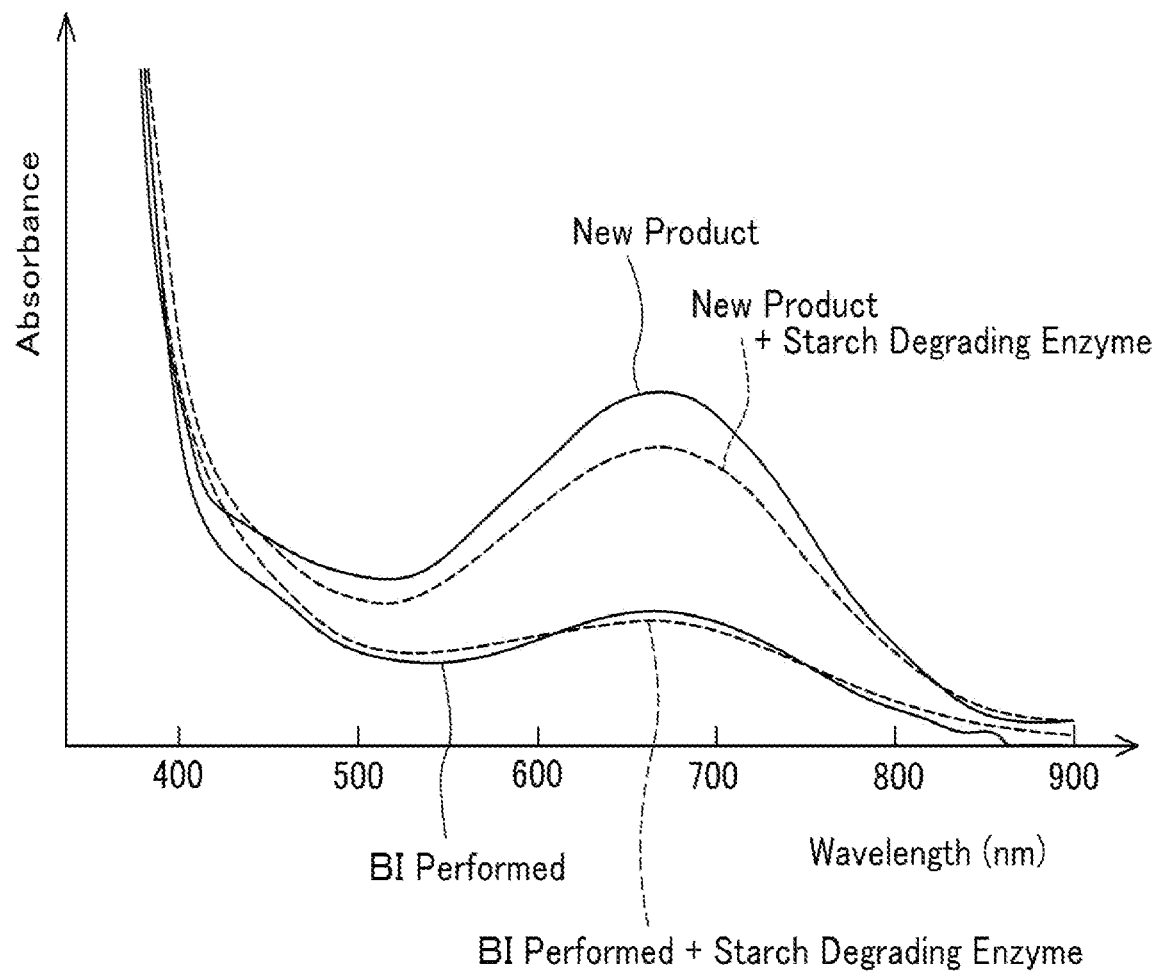
FIG. 3 is a graph representing examples of absorbance about the iodine color reaction of eluted substances from a washing member and illustrates cases where a starch degrading enzyme is added (dotted lines) and cases where the starch degrading enzyme is not added (solid lines), with respect to each of a state before break-in treatment and a state after break-in treatment.
Figure 4:
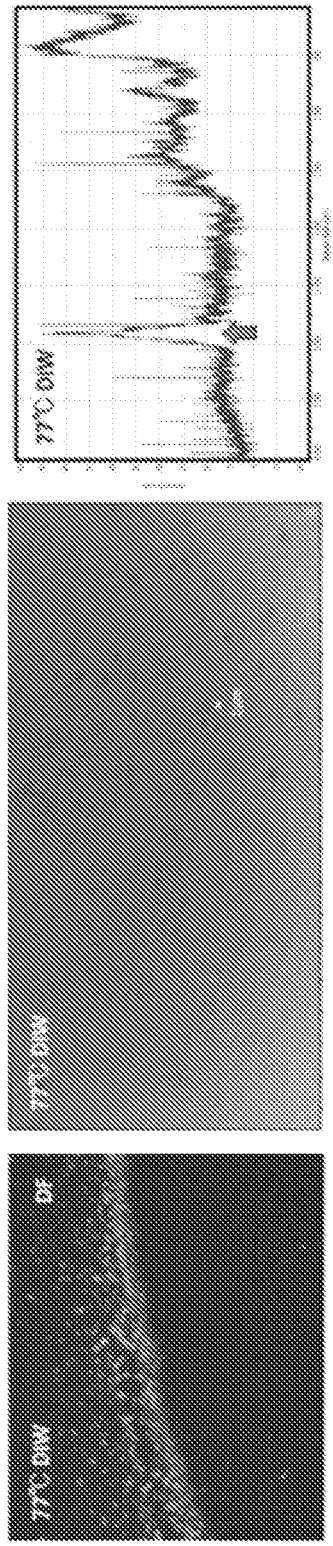
FIG. 4 illustrates examples of dark field images (left side) and bright field images (right side) of a substrate surface that are obtained after cleaning treatment is applied to the washing member, in which (A) illustrates a case where the treatment is performed by heated pure water and (B) illustrates a case where washing treatment is applied in a heated starch degrading enzyme solution.
Figure 4:
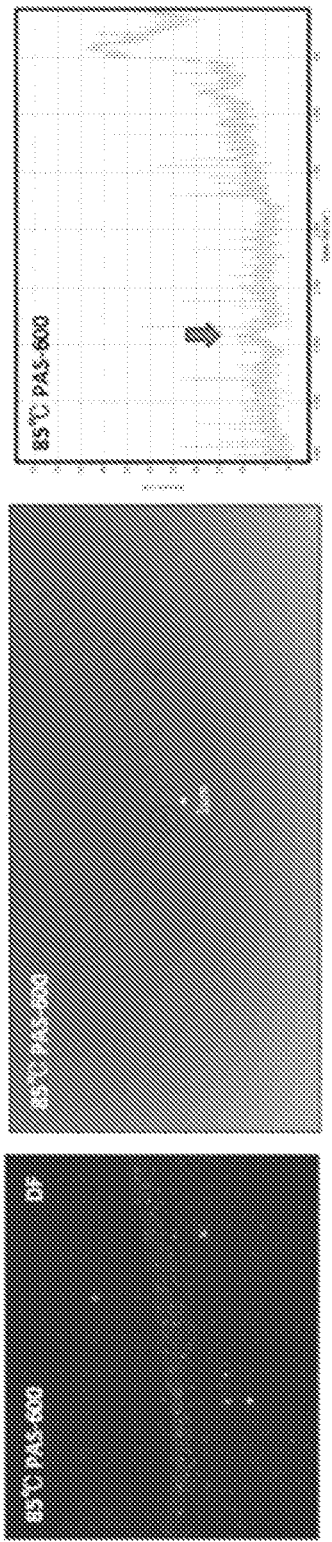
Figure 5:
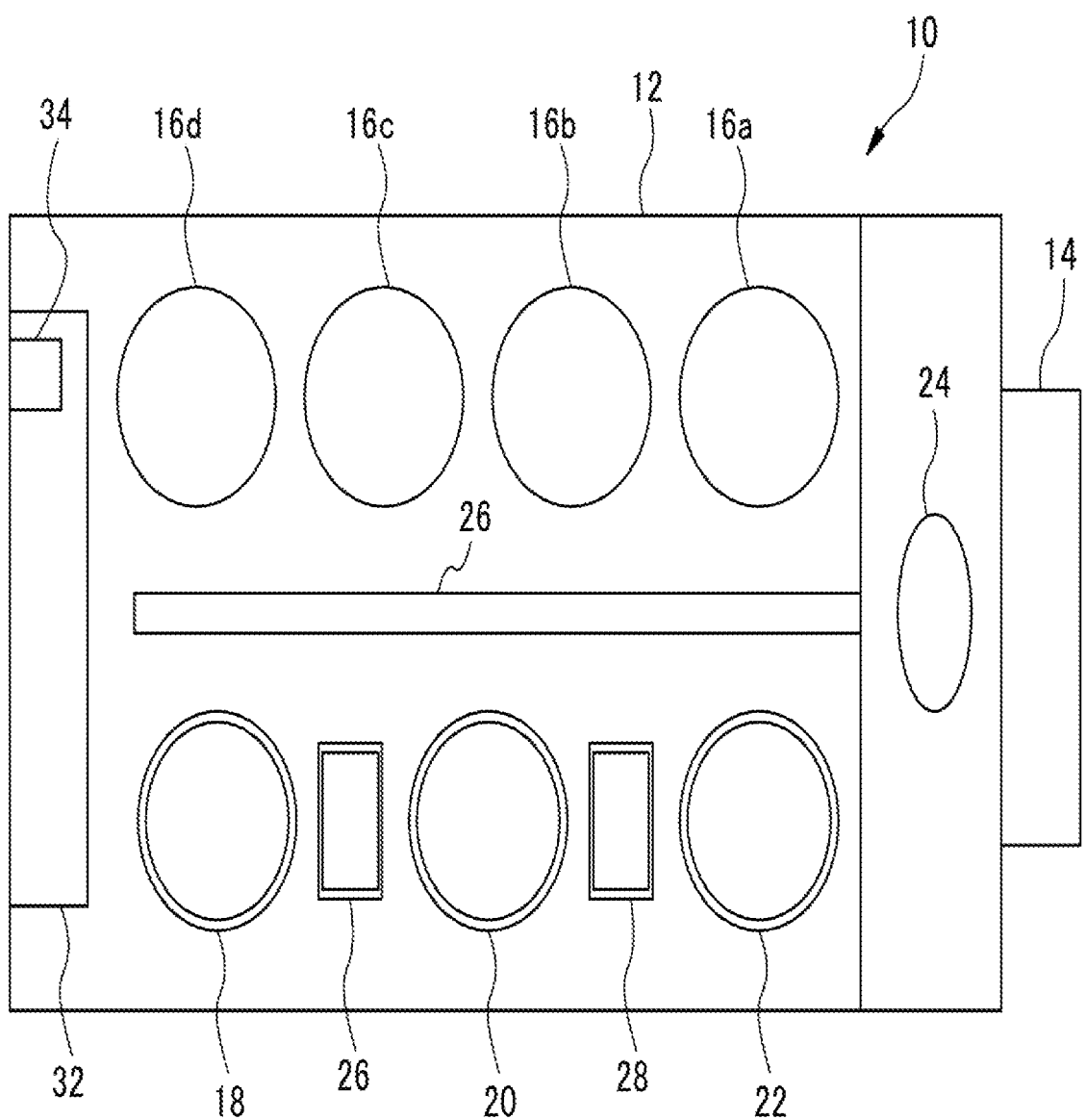
FIG. 5 is a plan view illustrating a schematic configuration of a substrate treatment device including a substrate washing device according to one embodiment of the present invention.

Embodiments of the present invention will hereinafter be described with reference to drawings. FIG. 5 illustrates an outline of a substrate treatment device including a substrate washing device according to the present embodiment, and a substrate treatment device 10 has a housing 12 and a load port 14. In the load port 14, an open cassette is installed that houses many substrates W, for example.

The housing 12 houses plural polishing units 16a to 16d for polishing (planarizing) the substrates W, a first washing unit 18 and a second washing unit 20 that wash the polished substrate W, and a drying unit 22 that dries the washed substrate W. In the example in FIG. 5, the polishing units 16a to 16d are aligned in the longitudinal direction of the substrate treatment device 10, and the washing units 18 and 20 and the drying unit 22 are aligned in parallel with the polishing units 16a to 16d.

A first conveyance robot 24 is arranged between the load port 14 and the polishing unit 16a and drying unit 22 that are positioned on the load port 14 side, receives the substrate W that is not yet polished from the load port 14, passes the substrate W to a conveyance unit 24, and receives the dried substrate W that is taken out from the drying unit 22 from the conveyance unit 24. Further, a conveyance unit 26 is arranged between the polishing units 16a to 16d and the washing units 18 and 20 and drying unit 22.

Between the first washing unit 18 and the second washing unit 20, a second conveyance robot 26 is arranged that passes the substrate W between those. Further, between the second washing unit 20 and the drying unit 22, a third conveyance unit 28 is arranged that passes the substrate W between those.

In the housing 12, a control unit 32 is arranged that controls actions of apparatuses of the substrate treatment device 10. In the present embodiment, the control unit 32 is arranged in the housing 12, but a configuration may be made such that the control unit 32 is arranged in an outside portion of the housing 12 and is connected with the substrate treatment device 10 via a network. Further, the control unit 32 includes an input unit 34 that accepts an external input. Here, the external input can include mechanical operations by a user and inputs of signals from an external device in a wired or wireless manner.

The washing units 18 and 20 of the present embodiment wash the substrate W by causing a washing tool to contact with a surface of the substrate W while causing the washing tool, which will be described later, to rotate itself. Further, as the washing units 18 and 20, a two-fluid jet washing device may be used that washes the surface of the substrate W by a two-fluid jet in combination with the washing tool.

As one example, the drying unit 22 dries the substrate W by jetting IPA vapor from a nozzle, which is not illustrated, toward the rotating substrate W. Alternatively, the substrate W may be dried by a centrifugal force by rotating the substrate W at a high speed.

Figure 6:
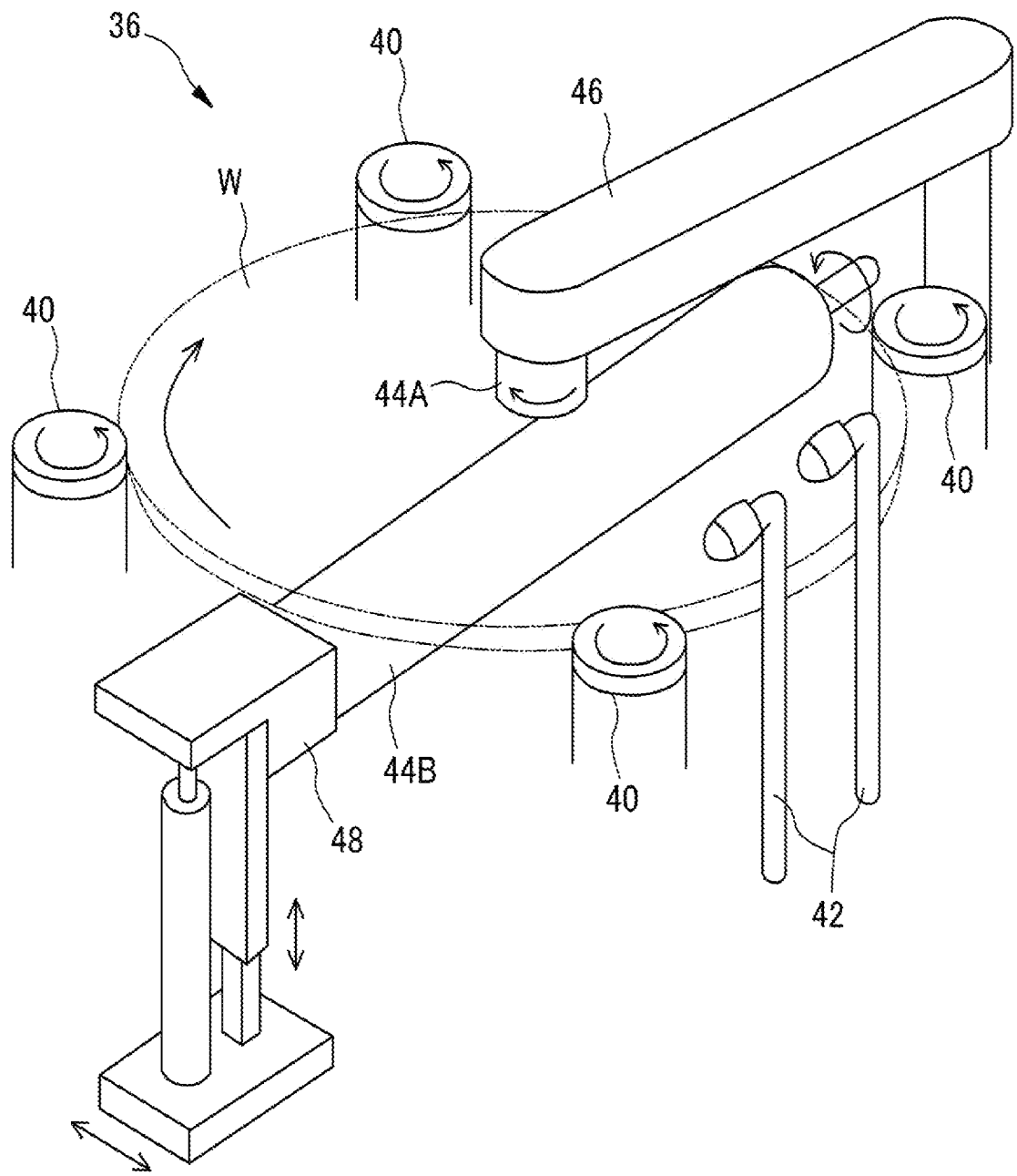
FIG. 6 is a perspective view illustrating a configuration of the substrate washing device according to one embodiment of the present invention.
Figure 7:
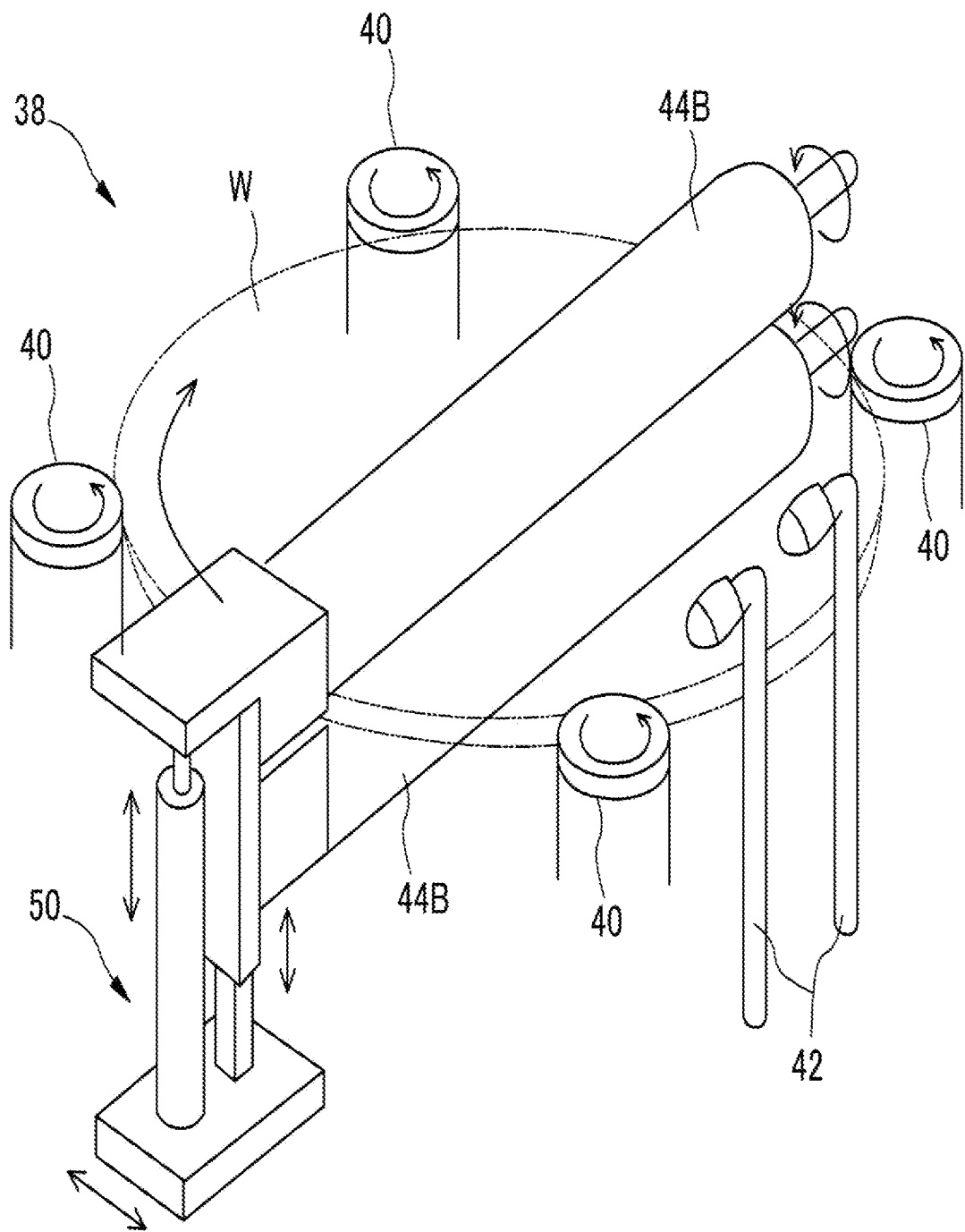
FIG. 7 is a perspective view illustrating a configuration of a substrate washing device according to another embodiment of the present invention.

FIG. 6 is a perspective view illustrating a schematic configuration of a substrate washing device 36 according to one embodiment, and FIG. 7 is a perspective view illustrating a schematic configuration of a substrate washing device 38 according to another example. Each of the substrate washing devices 36 and 38 (corresponding to the substrate washing units 18 and 20 in FIG. 5) has a substrate rotation mechanism that retains and rotates the substrate W and a washing liquid supply unit 42 that supplies a washing liquid to the substrate W. As the washing liquid, for example, in accordance with film types of substrate surfaces to be targets, a rinsing liquid such as ultrapure water (DIW), an alkali-based solution (aqueous ammonia or an ammonia hydrogen peroxide mixture (SC1)), a surfactant, a chemical liquid such as a chelating agent, or a mixture chemical liquid of those can be used.

The substrate W rotates around its central axis as a rotation axis. In the present embodiment, a description will be made about a form where the surface of the substrate W extends along a horizontal direction and the rotation axis extends in a perpendicular direction, but this is not restrictive. The substrate rotation mechanism of the present embodiment has four support members 40 that support an outer periphery of the substrate W. The support member 40 is a spindle or a chuck, for example, and rotates the substrate W by rotation.

The substrate washing device 36 includes the washing tool that washes the substrate W in contact with the washing tool. In the example in FIG. 6, as washing tools, a pen member 44A that itself rotates around a rotation axis generally vertical to the surface of the substrate W and a roll member 44B that linearly extends throughout almost the whole diameter of the substrate W are used. Further, in the example in FIG. 7, as the washing tools, a pair of roll members 44B are used that linearly extend throughout almost the whole diameter of the substrate W.

The substrate washing device 36 according to FIG. 6 includes washing tool rotation mechanisms 46 and 48, which rotate the pen member 44A and the roll member 44B as the washing tools while respectively retaining those, and rotates the pen member 44A around the rotation axis generally vertical to the surface of the substrate W. Further, the substrate washing device 38 according to FIG. 7 includes a washing tool rotation mechanism 50, which rotates the roll member 44B as the washing tool around a rotation axis parallel with the surface of the substrate W while retaining the roll member 44B. Further, the washing tool rotation mechanisms 46, 48, and 50 move the washing tool 44A and 44B in parallel with the surface of the substrate W and thereby move the washing tools 44A and 44B to contact positions at which those contact with the substrate W or stand-by positions not illustrated.

In the example illustrated in FIG. 6, the pen member 44A washes an upper surface of the substrate W, and the roll member 44B washes a lower surface of the substrate W. Further, in the example illustrated in FIG. 7, the pair of roll members 44B wash a front surface and a back surface of the substrate W. However, it is sufficient that the substrate W is washed by contact of the washing tools with the surface of the substrate W, and a configuration of the substrate washing device is not limited to the example in FIG. 6 or FIG. 7.

In the new washing tools 44A and 44B, particles to be causes of pollution adhere to their surfaces and internal portions, and the new washing tools 44A and 44B in such a state cannot be used for washing of a semiconductor device. In a case where washing treatment of the substrate W is performed by using such washing tools, a clean substrate W may be polluted by the washing tools. Thus, before the new washing tool is used for substrate treatment, a predetermined washing treatment (break-in) is performed.

Figure 8:
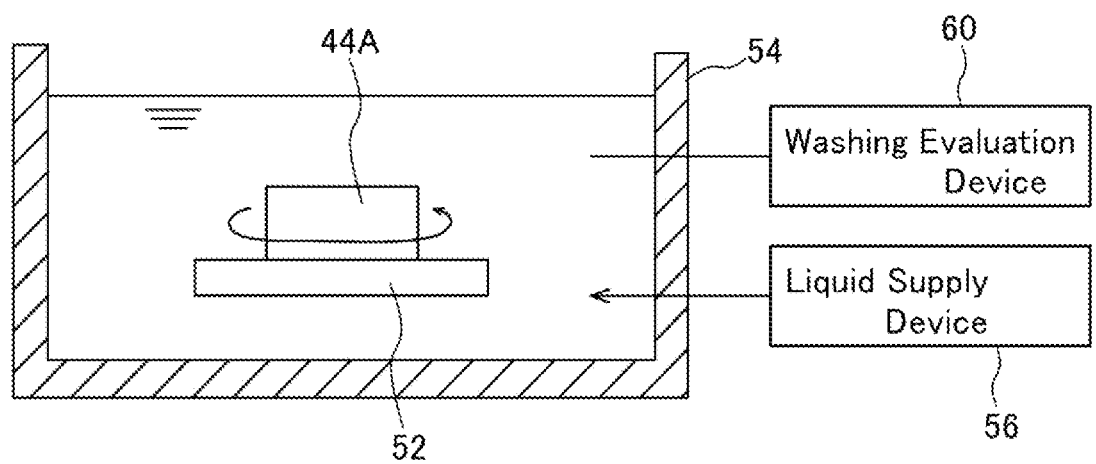
FIG. 8 is a diagram schematically illustrating self-cleaning of a pen member.
Figure 9:
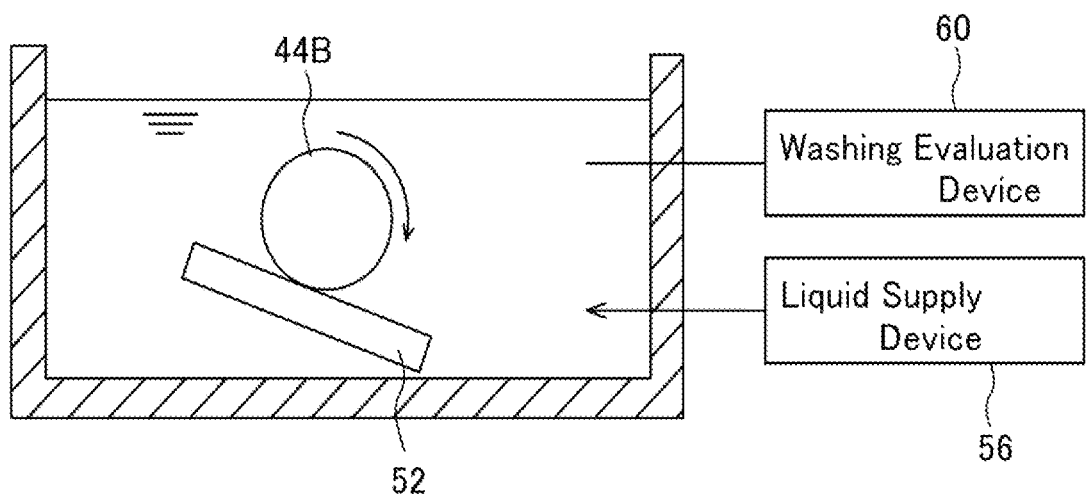
FIG. 9 is a diagram schematically illustrating self-cleaning of a roll member.

FIG. 8 is a diagram schematically illustrating a configuration of a device that performs the break-in of the pen member 44A, and FIG. 9 is a diagram schematically illustrating a configuration of a device that performs the break-in of the roll member 44B. As illustrated in FIG. 8 and FIG. 9, a cleaning member 52 is arranged in a liquid tank 54. The cleaning member 52 is formed with an inorganic-oxide-based material such as a quartz plate or a sapphire plate or an organic-polymer-based material, whose chemical resistance is high and whose leachability is low, such as PTFE, PVDF, PFA, PPS, PEEK, or PMMA, for example. Further, in the liquid tank 54, a liquid (washing liquid) is reserved such as a rinsing liquid such as ultrapure water (pure water) (DIW), an alkali-based solution (aqueous ammonia or an ammonia hydrogen peroxide mixture (SC1)), or a chemical liquid such as a starch degrading enzyme solution, for example.

A liquid supply device 56 is connected with the liquid tank 54, a chemical liquid is thereby supplied as the washing liquid to the liquid tank 54 in washing by the chemical liquid, and pure water is supplied as the washing liquid to the liquid tank 54 in the rinsing treatment. A configuration may be made such that the washing liquid is caused to circulate to the liquid tank 54 while being purified. Further, a temperature of the liquid reserved in the liquid tank 54 can preferably be adjusted by a temperature adjustment mechanism such as a heater. In addition, the liquid tank 54 may be provided with a vibration unit that applies ultrasonic vibration in the liquid tank 54 in cleaning the washing tool 44A or 44B.

As illustrated in FIG. 8, when the pen member 44A is cleaned, the pen member 44A is pressed onto the cleaning member 52 while the washing tool rotation mechanism 46 rotates the pen member 44A. FIG. 8 illustrates an example where a surface of the cleaning member 52 is perpendicular to the rotation axis of the pen member 44A, but such an example is not restrictive.

Further, as illustrated in FIG. 9, when the roll member 44B is cleaned, the roll member 44B is pressed onto the cleaning member 52 while the washing tool rotation mechanisms 48 and 50 rotate the roll member 44B. In the example illustrated in FIG. 9, it is assumed that the surface of the cleaning member 52 is inclined with respect to a vertical direction and the roll member 44B moves in the vertical direction and contacts with the cleaning member, but such an example is not restrictive.

Figure 10:
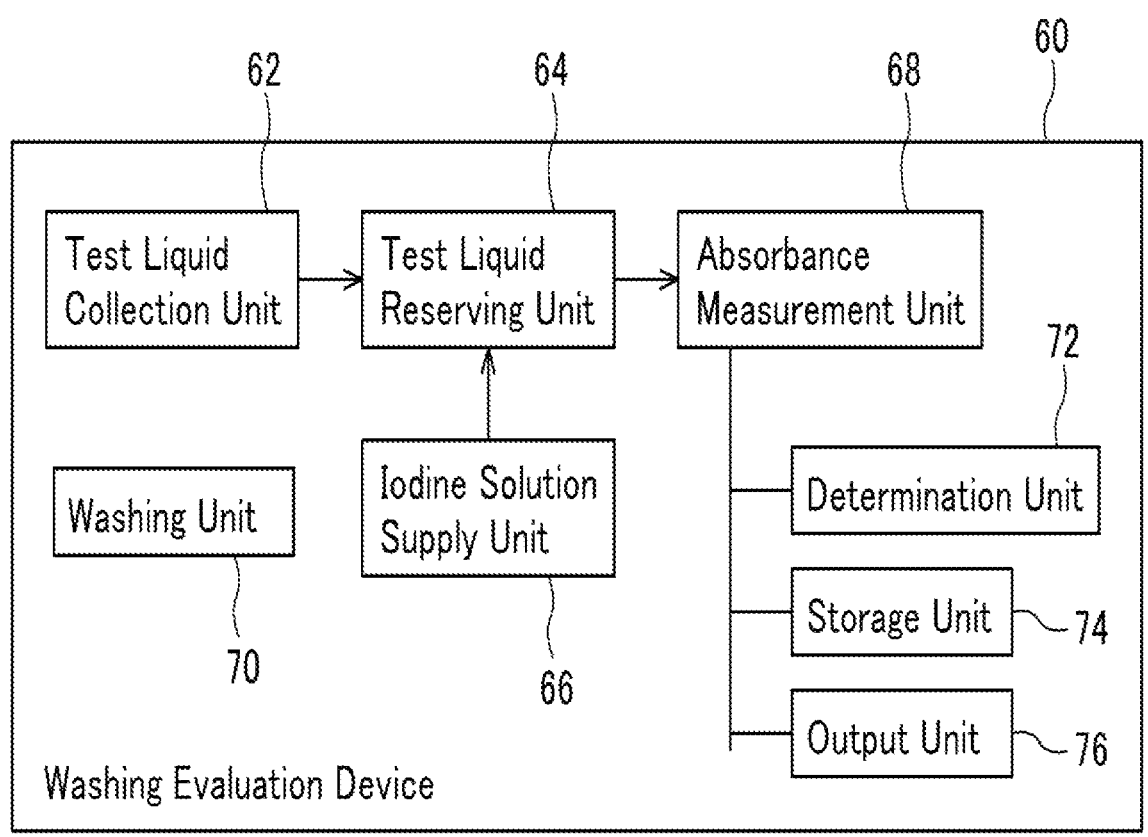
FIG. 10 is an explanatory diagram illustrating a function configuration of a washing evaluation device.

In FIG. 8 and FIG. 9, a discharged liquid from the liquid tank 54 is discharged to an outside portion of the device or is sent to the liquid supply device 56 by a circulation mechanism not illustrated and is reused. Further, the liquid tank 54 is connected with a washing evaluation device 60 for evaluating an extent of washing of the washing tools 44A and 44B. FIG. 10 is a block diagram illustrating one example of a configuration of the washing evaluation device, and the washing evaluation device 60 includes a test liquid collection unit (liquid extraction unit) 62, a test liquid reserving unit 64, an iodine solution supply unit (color reaction unit) 66, an absorbance measurement unit 68, a washing unit 70, a determination unit 72, a storage unit 74, and an output unit 76. The washing evaluation device and the liquid tank are provided in or an adjacent position to the substrate washing device 36 or 38, and washing by the chemical liquid and the rinsing treatment by pure water are applied to the washing tool 44A or 44B in the break-in treatment. Note that the test liquid collection unit 62 and the test liquid reserving unit 64 can be combined together as a liquid extraction unit of the present invention. Further, the iodine solution supply unit 66 and the test liquid reserving unit 64 can be combined together as a color reaction unit of the present invention. In addition, the liquid extraction unit and the color reaction unit of the present invention are not limited to configurations described in the present embodiment.

The washing liquid and pure water for rinsing may be supplied from a liquid supply device 56 to the liquid tank 54 as illustrated in FIG. 8 or FIG. 9. However, the washing liquid and pure water can be supplied by pressure from the liquid supply device 56 toward an outside portion of the brush via a liquid supply opening provided in an internal portion of the brush 44A or 44B. In a case of the method of supply by pressure, it becomes possible to effectively push out foreign substances that are present on a deep inside of the brush. Further, a manner may be used in which the washing liquid and the pure water for rinsing are directly jetted to the brush by a spray or the like while a water depth of the liquid tank 54 is made shallow and an almost all part of the brush is exposed.

The test liquid collection unit 62 includes a test liquid collection opening and a negative-pressure production mechanism, presses the test liquid collection opening onto the surface of the washing tool 44A or 44B after washing and the rinsing treatment, reduces a pressure inside the test liquid collection opening by the negative-pressure production mechanism, and draws and collects a liquid (pure water that can contain eluted substances from the washing tool 44A or 44B and that will hereinafter be referred to as "remaining liquid") remaining in pores in the surface of the washing tool 44A or 44B as a PVA sponge. The test liquid reserving unit 64 accumulates the remaining liquid collected from the PVA sponge by the test liquid collection unit 62. When an accumulation amount of the remaining liquid by the test liquid reserving unit 64 reaches a predetermined amount (for example, 3 to 5 cc), drawing and collection of the remaining liquid by the test liquid collection unit 62 are finished.

The iodine solution supply unit 66 includes a reserving tank that stocks an iodine solution at a certain concentration and a supply opening that supplies the iodine solution, supplies the iodine solution to the test liquid reserving unit 64 when the remaining liquid accumulated in the test liquid reserving unit 64 reaches a predetermined amount, and thereby causes a color reaction with the remaining liquid.

The absorbance measurement unit 68 includes a light irradiation unit that irradiates the remaining liquid in the test liquid reserving unit 64, to which the iodine solution is supplied, with measurement light in a predetermined wavelength range and an absorbance measurement apparatus that measures the degree of coloration of the remaining liquid irradiated with the measurement light by absorbance measurement. The measurement light used in irradiation by the light irradiation unit preferably includes light at a wavelength of 670 nm. Further, a measurement wavelength range of the absorbance measurement apparatus is preferably set to 600 to 800 nm.

The determination unit 72 determines whether the absorbance measured by the absorbance measurement unit 68 is less than a predetermined threshold value and sends an indication that washing of the washing tool 44A or 44B has to be finished to the output unit 76 in a case where the absorbance is less than the predetermined threshold value. On the other hand, in a case where a measurement value of the absorbance is equivalent to or more than the threshold value, an instruction to continue washing of the washing tool 44A or 44B is sent to the substrate washing device 36 or 38. Accordingly, without performing an inspection by a defect inspection device, it is possible to evaluate an extent of remaining pollutants, which can become causes of defects, such as residual starch or PVA in the washing tool.

The storage unit 74 stores information about the threshold value. Further, the storage unit 74 may be configured to store information of a result of absorbance measurement that is performed by adding the iodine solution to pure water (not used for the rinsing treatment for the washing tool 44A or 44B) and to subtract a measurement value about pure water from each of measurement values of the absorbance measurement about the remaining liquids from the washing tools 44A and 44B.

The washing unit 70 performs washing treatment by pure water for the test liquid collection unit 62 and the test liquid reserving unit 64 at each time when the absorbance measurement of the remaining liquid is performed by the washing evaluation device 60. Accordingly, when the absorbance measurement for the remaining liquid is performed, an influence (contamination) of the remaining liquid used in the absorbance measurement that is previously performed is prevented.

Figure 11:
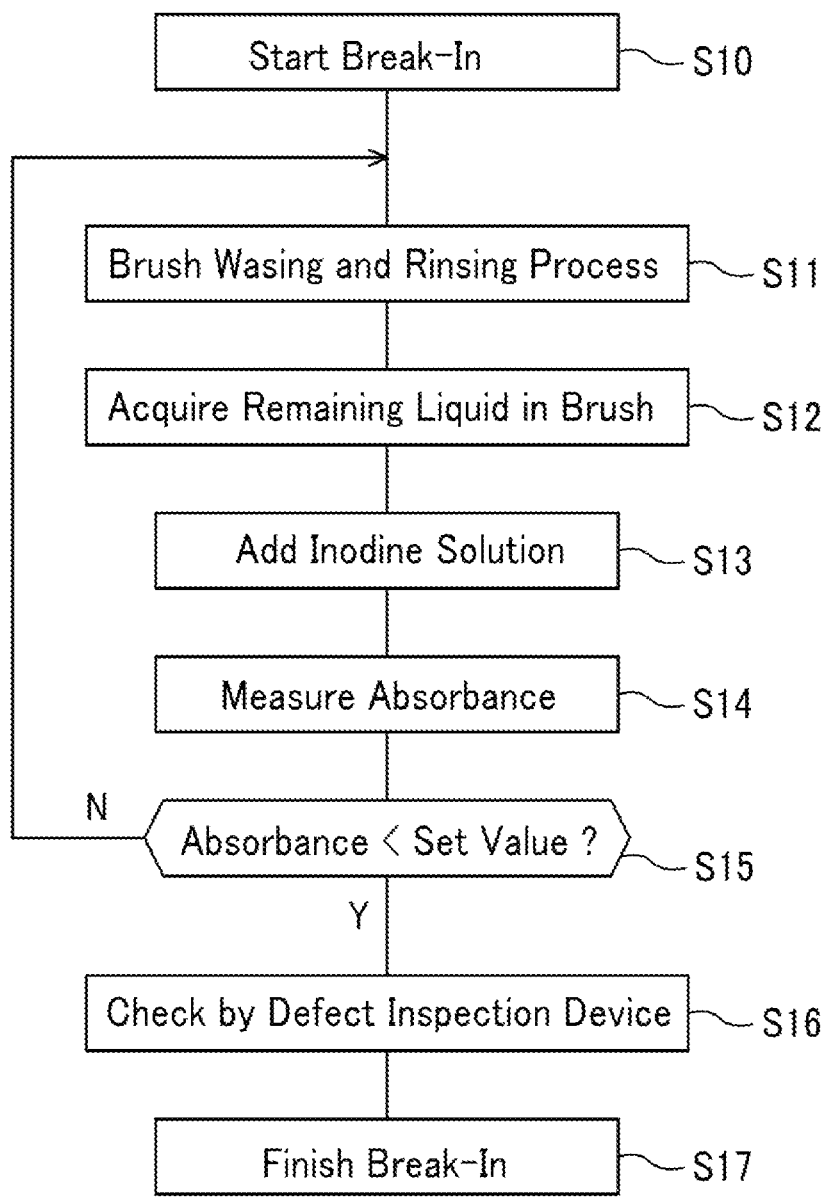
FIG. 11 is a flowchart illustrating procedures of a washing evaluation process.

In the following, by using a flowchart in FIG. 11, a description will be made about procedures of the break-in of the washing tool with the above configuration. When the washing tool 44A or 44B is replaced and the break-in is started (step S10), the washing tool 44A or 44B is set in the liquid tank 54 filled with the chemical liquid. The washing tool 44A or 44B rotates while pressed onto the cleaning member 52, the washing tool 44A or 44B is washed, and further the rinsing treatment by pure water is applied (step S11).

When the rinsing treatment is finished, the test liquid collection unit 62 acquires the remaining liquid in the washing tool 44A or 44B, and the test liquid reserving unit 64 draws and collects the acquired remaining liquid (step S12). When a certain amount of the remaining liquid is acquired, the iodine solution supply unit 66 supplies the iodine solution to the remaining liquid in the test liquid reserving unit 64 (step S13). The absorbance measurement unit 68 irradiates the remaining liquid, which exhibits an iodine color reaction by supply of the iodine solution, with inspection light in a predetermined wavelength range and thereby measures the absorbance of the remaining liquid (step S14). Note that as for the measurement of the absorbance, a configuration may be made such that the value resulting from subtraction of the measurement value of the absorbance of the pure water to which the iodine solution is added (in advance stored in the storage unit 74) can be output as the measurement value. Data obtained by the measurement are stored in the storage unit 74 of the washing evaluation device 60.

When the measurement of the absorbance is completed, the determination unit 72 determines whether the measurement value of the absorbance at a predetermined wavelength (for example, around 670 nm) is less than a predetermined set value (step S15), determines that the iodine color reaction by starch and cross-linked PVA is sufficiently low (that is, starch and cross-linked PVA are sufficiently removed from the washing tool 44A or 44B after the washing and rinsing treatment) in a case where the measurement value is less than the predetermined set value, and outputs an indication that evaluation by the iodine solution is finished. Subsequently, a substrate for test for which the washing treatment is performed by the washing tools 44A and/or 44B is set in the defect inspection device, and a check about presence or absence of defects is conducted (step S16). Accordingly, the break-in treatment is finished (step S17). Note that a configuration may be made such that the check by the defect inspection device is skipped. Further, as the set value of the absorbance, data of absorbance measurement values for brushes about which the break-in was determined to be finished in the past may be used.

On the other hand, in a case where the measurement value of the absorbance is equivalent to or more than the predetermined set value ("N" in step S15), the procedure is again returned to step S11, the washing and rinsing treatment for the brush is again applied to the washing tool 44A or 44B, and the absorbance is measured. Accordingly, a frequency of checks about presence or absence of defects by the defect inspection device can be reduced, and shortening and higher efficiency of the break-in treatment can be achieved.

Further, the absorbance is measured after the iodine color reaction by the iodine solution, a starch degrading enzyme may thereafter be added, and the absorbance may again be measured. In this case, after addition of the starch degrading enzyme, only the iodine color reaction due to cross-linked PVA remains (the iodine color reaction due to starch disappears). Thus, by detecting a decreased amount of the absorbance in a case where the starch degrading enzyme is added, a determination about defects due to each of starch and cross-linked PVA becomes possible. Accordingly, compared to particle measurement in rinsing water by using a liquid particle counter, an advantage is present where types of defects can be determined. Further, many bubbles are contained in the rinsing water, but the liquid particle counter has difficulty in distinction between bubbles and particles, and in view of such a situation, a determination by an iodine color reaction method has higher reliability.

In the above embodiment, evaluation about presence or absence of defects is performed by comparing the measurement value of the absorbance with the set value, but the present invention is not limited to the above form. For example, the evaluation about presence or absence of defects may be performed based on whether the measurement value of the absorbance reaches a measurement limit.

Further, instead of extracting the remaining liquid in the washing tool 44A or 44B for which the rinsing treatment is finished, an outflow liquid from the washing tool 44A or 44B may be acquired by washing, by rubbing, the washing tool 44A or 44B after the rinsing treatment and may thereby be used for the measurement of the absorbance. Alternatively, a liquid seeping from the washing tool 44A or 44B in the rinsing treatment may be acquired and be used for the measurement of the absorbance.

Alternatively, the chemical liquid, which is used not in the rinsing treatment but in washing of the washing tool 44A or 44B by the chemical liquid, may directly be acquired and be used for the measurement of the absorbance. In this case, a configuration is preferably made such that the acquired chemical liquid is neutralized to reach such a pH that the iodine color reaction is not hindered and the iodine solution is thereafter added.

In addition, the evaluation about presence or absence of defects may be performed by using not only monitoring of starch eluted substances and cross-liked PVA but also eluted substances derived from uncross-linked PVA. Specifically, the iodine solution is added after adding an aggregation promoting agent (PVA cross-linking agent) to the remaining liquid in the rinsed washing tool 44A or 44B to generate an inspection liquid (inspection liquid 1), and the absorbance is measured. The measurement value (measurement value A) in this case becomes a value resulting from eluted substances derived from starch and eluted substances derived from PVA. Next, a starch degrading reagent is added to the inspection liquid 1 (or the remaining liquid to which the PVA cross-linking agent is added) to generate an inspection liquid (inspection liquid 2) from which the eluted substances derived from starch are removed, and the absorbance is measured. The measurement value (measurement value B) in this case becomes a value resulting from eluted substances derived from uncross-linked and cross-linked PVA. Then, a configuration is made such that in a case where the measurement value A is smaller than a predetermined set value and the measurement value A and the measurement value B are almost equivalent values, evaluation by the iodine solution is finished and in other cases, the washing and rinsing treatment for the brush is again performed. Accordingly, evaluation can be performed about whether each of the starch eluted substances and eluted substances derived from PVA becomes sufficiently small. Alternatively, the evaluation by the iodine solution may be finished in a case where the measurement value A becomes less than the measurement limit of the absorbance.

Further, pure water supply is stopped after the rinsing treatment for the washing tool 44A or 44B by pure water, the washing tool 44A or 44B is rotated for a predetermined time period (for example, one minute) while pressing onto the cleaning member is maintained, and a liquid in the brush may thereafter be acquired. Accordingly, the washing tool 44A or 44B is rinsed by the same rinsing water, concentrations of the eluted substances from the washing tool 44A or 44B, and an improvement in analytical sensitivity by the absorbance measurement can thus be achieved.

Further, when the washing tool 44A or 44B is washed, the washing liquid is not drained without any treatment, but the washing liquid that is foamed may be supplied to the washing tool 44A or 44B. Specifically, the washing liquid is foamed by a method such as supplying clean air via a gas dissolving membrane (such that the clean air has solubility equivalent to or more than solubility of the washing liquid)

or foaming by mechanical agitation with a surfactant. Because in the break-in, only the washing liquid that contacts with the surface of the washing tool 44A or 44B contributes to washing, in a form where the washing liquid flows in, an almost all part of the washing liquid is discarded without contributing to washing. The amount of the washing liquid can significantly be decreased by using the washing liquid in a foamed state, and costs for the break-in can be lowered.

Further, in the present embodiment, the evaluation about presence or absence of defects is performed by the absorbance measurement, but for example, a color sample of a coloration degree corresponding to a target value is in advance prepared, the colors of the eluted substances to which the iodine solution has been added are compared with the color sample, and the evaluation of presence or absence of defects may thereby be performed.

Second Embodiment

Figure 12:
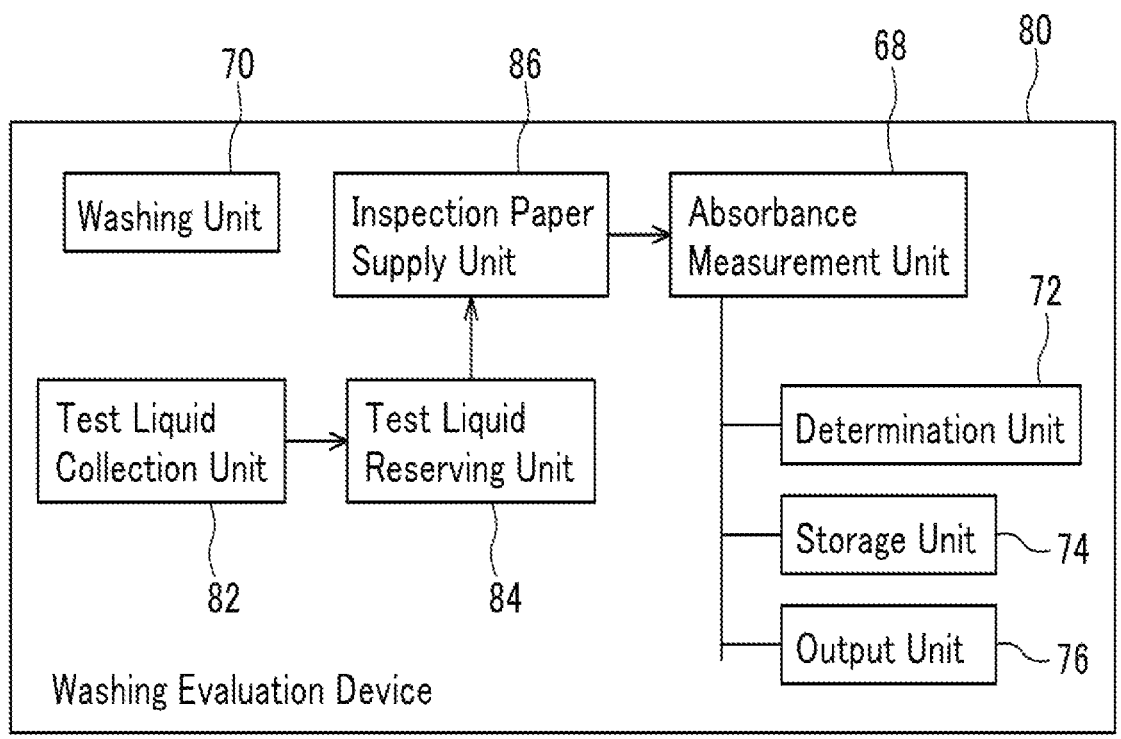
FIG. 12 is an explanatory diagram illustrating another example of a function configuration of a washing evaluation device.

FIG. 12 illustrates a configuration of a washing evaluation device according to a second embodiment, instead of adding the iodine solution, a discharged liquid is filtered by a filter paper impregnated with and adsorbing iodine, the filter paper is thereby colored, and the absorbance of the colored filter paper is measured. Note that the same reference characters are given to the same configuration members as those, including the substrate washing devices 36 and 38 (see FIG. 6 and FIG. 7), which are described in the above first embodiment, and detailed descriptions thereof will not be made. A washing evaluation device 80 includes a test liquid collection unit (liquid extraction unit) 82, a test liquid reserving unit 84, an inspection paper supply unit (color reaction unit) 86, the absorbance measurement unit 68, the washing unit 70, the determination unit 72, the storage unit 74, and the output unit 76 and is provided in or an adjacent position to the substrate washing device 36 or 38. Note the test liquid collection unit 82 and the test liquid reserving unit 84 are combined together as the liquid extraction unit of the present invention. Further, an iodine solution supply unit 86 and the test liquid reserving unit 84 are combined together as the color reaction unit of the present invention. In addition, the liquid extraction unit and the color reaction unit of the present invention are not limited to configurations described in the present embodiment.

The test liquid collection unit 82 collects a liquid (rinsing discharged water) that is discharged when the washing tool 44A or 44B is rinsed by pure water. As a form of collection, for example, channels of the rinsing discharged water are switched, and the rinsing discharged liquid may thereby be caused to fall into the test liquid reserving unit 84 by gravity, or the rinsing discharged liquid in a rinsing discharged water channel may be collected into the test liquid reserving unit 84 by pressure reduction similarly to the above first embodiment. The test liquid reserving unit 84 accumulates the rinsing discharged water from the washing tool 44A or 44B by the test liquid collection unit 82. When an accumulation amount of the discharged liquid by a test liquid reserving unit 84 reaches a predetermined amount (for example, 3 to 5 cc), collection of the discharged liquid by the test liquid collection unit 82 is finished.

Plural pieces of filter paper that are in advance impregnated with and adsorb the iodine solution are prepared in the inspection paper supply unit 86 and are colored by filtering the discharged liquid (rinsing discharged liquid) from the test liquid reserving unit 84. The absorbance measurement unit 68 measures the absorbance of the filter paper that is colored by the filtration by a method similar to the first embodiment. In this method also, the frequency of checks about presence or absence of defects by the defect inspection device can be reduced, and shortening and higher efficiency of the break-in treatment can be achieved.

Third Embodiment

In the above embodiments, configurations are made such that presence or absence of defects is checked by using the eluted substances in a case where the washing tool 44A or 44B is cleaned by using a dedicated cleaning member; however, the present invention is not limited to those, and a configuration may be made such that the evaluation about presence or absence of defects in the washing tool 44A or 44B is performed in the substrate washing unit. For example, the break-in using the washing liquid and the rinsing liquid is performed in the washing unit by using a dummy substrate, the iodine solution is added to the rinsing discharged liquid that is discharged in the break-in (or the remaining liquid that remains in the washing tool 44A or 44B after the rinsing treatment or a rinsing waste liquid in a case where the washing liquid is supplied from an internal portion of the washing tool), the absorbance measurement is performed, and an inspection about presence or absence of defects by using the iodine color reaction may thereby be performed. In this method also, the frequency of checks about presence or absence of defects by the defect inspection device can be reduced, and shortening and higher efficiency of the break-in treatment can be achieved. Note that an arbitrary substrate can be used as the dummy substrate, but in a semiconductor process, a TEOS film substrate is often used.

Fourth Embodiment

In the above embodiments, an inspection about presence or absence of defects is performed based on a measurement result of the absorbance measurement. However, for example, machine learning is performed about images of samples exhibiting the iodine color reaction at time points when the break-in is finished, and a learned model is thereby generated, and the inspection about presence or absence of defects may be performed by image detection using the learned model.

Figure 13:
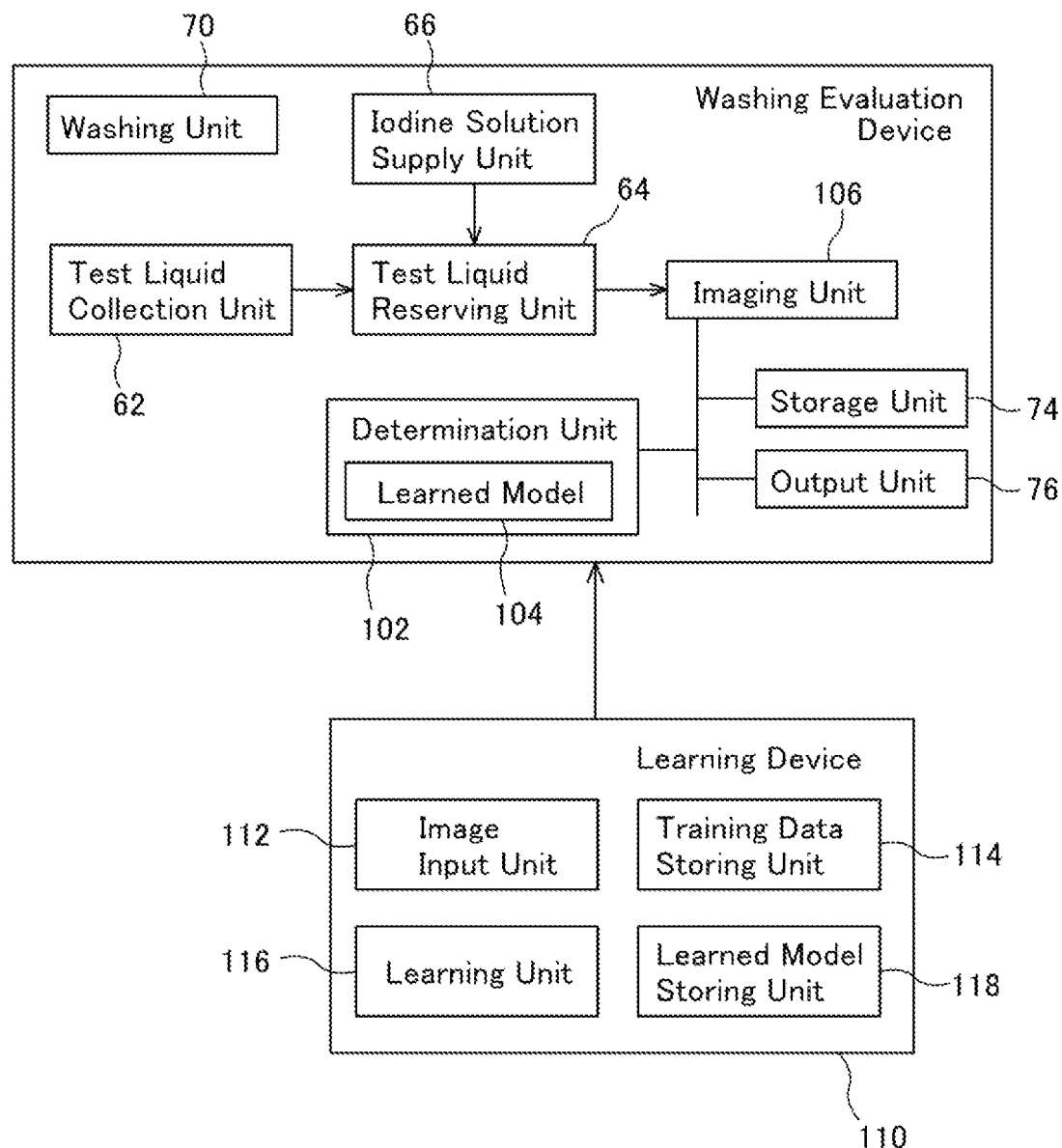
FIG. 13 is an explanatory diagram illustrating one example of a configuration of a washing evaluation device and a learning device.

FIG. 13 illustrates a configuration of a system in an embodiment in which the image detection using the learned model is performed. In FIG. 13, the system includes a washing evaluation device 100 and a learning device 110 that performs machine learning about sample images of the iodine color reaction. The washing evaluation device 100 includes a determination unit 102 including a learned model 104 and an imaging unit 106 that images a test liquid resulting from the iodine color reaction.

The learned model 104 is a learned machine learning model that has performed learning for estimating an extent of agreement between an image of the test liquid that is taken by the imaging unit 106 and an image taken after the break-in is finished, for example, by using a neural network. The learned model 104 is stored from the learning device 110 into the storage unit 74 of the washing evaluation device 100 and is read out by the determination unit 102 in a case where the inspection about presence or absence of defects by the image detection is performed in the washing evaluation device 100.

Figure 14:
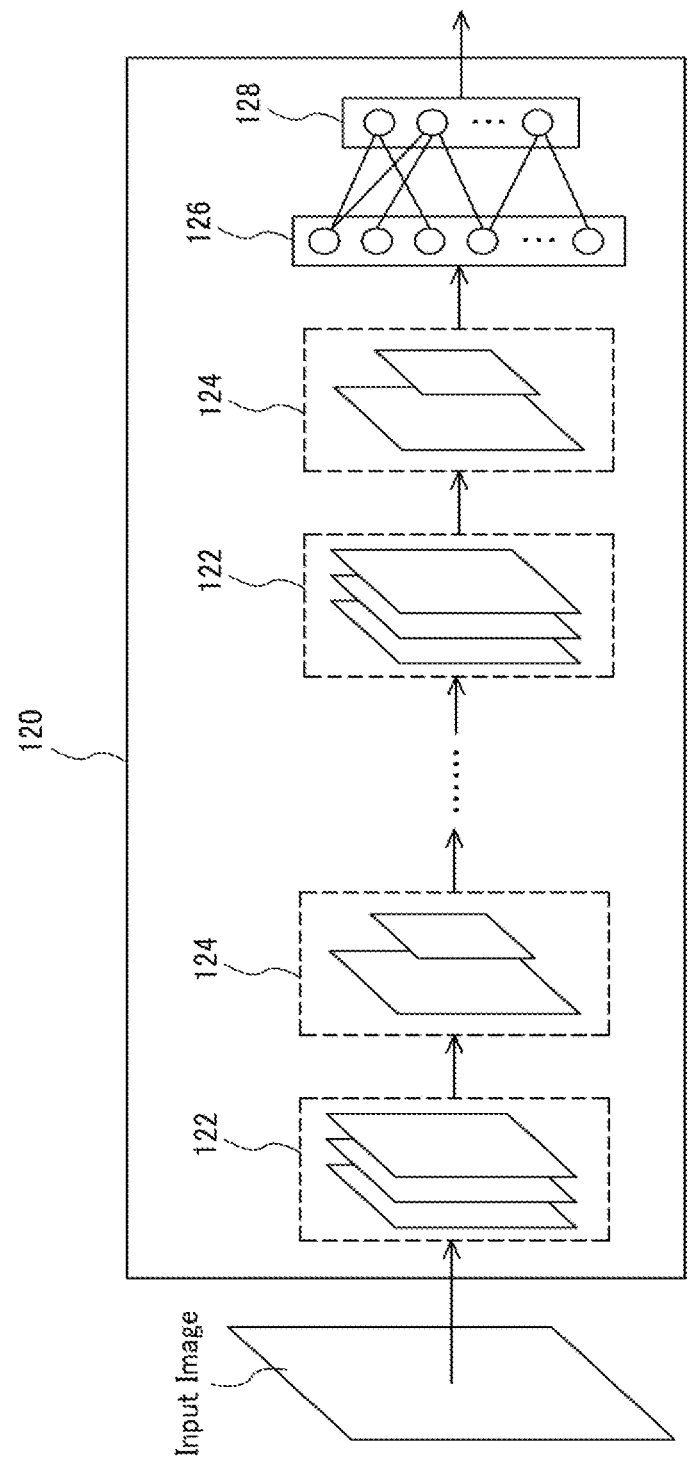
FIG. 14 is an explanatory diagram illustrating one example of a neural network.

As the neural network, for example, a convolutional neural network 120 illustrated in FIG. 14 is used. The convolutional neural network 120 has a structure in which convolutional layers 122 and pooling layers 124 are alternately connected, an output of the pooling layer 124 on an output side is input to a fully connected layer 126, and an output of the fully connected layer 126 is input to an output layer 128.

In the convolutional layers 122, the correlation between image data of an input image and a predetermined weighting filter is calculated, and a feature amount in each local region of an input image is thereby output. In the pooling layers 124, a maximum value or an average value is output about the feature amount in the local region that is output from the convolutional layers 122. The fully connected layer 126 is configured with plural layers, each of the layers includes one or plural neurons (nodes), and the neurons in adjacent layers are mutually linked. The output layer 128 is arranged on the farthest output side of the neural network 120 and outputs estimation information that indicates the extent of agreement between an input image of a sample and an image obtained after the break-in is finished.

A weight is set for a linkage between the neurons, and a threshold value is set for each of the neurons. An output of each neuron is decided based on whether the sum of the products of inputs to each of the neurons and the weights exceeds the threshold value, and the estimation information is thereby output in the neural network. In a case where a value of the estimation information output from the learned model exceeds a preset reference value, the determination unit 102 determines that the input image agrees with the image obtained after the break-in is finished and finishes the inspection about presence or absence of defects.

Note that the neural network in the present embodiment is not limited to the above neural network, but for example, a fully connected neural network may be used that includes an input layer, an intermediate layer, and an output layer, and a convolutional neural network and a fully connected network may be used in combination. In addition, a recursive neural network (for example, an LSTM network) may be provided that has a loop therein.

The learning device 110 is a general-purpose computer, for example, includes a CPU, a memory that stores a learning program, an input device, a display device, and so forth, and is connected with the washing evaluation device 100 via a communication line not illustrated. The learning device 110 starts a learning program that is in advance stored in a memory not illustrated (or installed through a network) and thereby acts as an image input unit 112, a training data storing unit 114, a learning unit 116, and a learned model storing unit 118. Note that the learning device 110 and the washing evaluation device 100 may be integrated.

The image input unit 112 stores, as training data, a taken image (sample image) in a case where the iodine solution is added to the remaining liquid in the washing tool when the rinsing treatment by pure water is performed for the washing tool for which the break-in is finished and from which pollutants such as starch are sufficiently removed, in the training data storing unit 114. The learning unit 116 includes an equivalent configuration to the above-described neural network 120, adjusts the weight and threshold value of each of the neurons such that the estimation information that exceeds the reference value is obtained as an output when the training data are input, and thereby performs learning for the neural network. At a phase where the estimation information that exceeds the reference value is output to plural sets of training data stored in the training data storing unit 114, learning is finished, and the result is stored as the learned model in the learned model storing unit 118. Further, the learning device 110 sends data of the learned model that finishes learning to the washing evaluation device 100, and the learned model 104 of the washing evaluation device 100 is thereby updated.

In the above embodiments, a description is made about cases, as examples, where the washing tool is set in the substrate washing device and the break-in treatment is thereafter performed; however, the present invention is not limited to those but can equivalently be applied to a form where the inspection about presence or absence of defects is performed for a washing tool before shipping, for example.

In the above embodiments, a description is made about cases, as examples, where the cleaning treatment is performed for the washing tool for performing the substrate washing in chemical mechanical polishing (CMP); however, the present invention is not limited to the CMP but can equivalently be applied to a form where scrub washing for a substrate is performed by using the PVA brush.

The above-described embodiments are described with the aim of enabling a person having ordinary skill in the art to which the present invention belongs to carry out the present invention. It goes without saying that various modifications of the above embodiments can be made by a person skilled in the art, and the technical ideas of the present invention can be applied to other embodiments. The present invention is not limited to the described embodiments and is construed in the broadest scope according to the technical ideas that are defined by the claims.

What is claimed is:

1. A cleaning apparatus performing cleaning treatment for a PVA sponge used for substrate washing by causing the PVA sponge to contact with a cleaning member while supplying a washing liquid to the PVA sponge, the cleaning apparatus comprising:
    a pump that extracts the washing liquid remaining in the PVA sponge or the washing liquid flowing out from the PVA sponge in the cleaning treatment;
    a reserving tank that generates a first reagent by applying an iodine color reaction to the washing liquid extracted by the pump and generates a second reagent by adding a starch degrading enzyme to the first reagent; and
    a processor that detects a coloration degree of the first reagent and the second reagent and determines whether or not cleaning of the PVA sponge is completed based on the detected coloration degree.

2. The cleaning apparatus according to claim 1, wherein the reserving tank reaction unit adds an iodine solution to the washing liquid.

3. The cleaning apparatus according to claim 1, wherein the reserving tank filters the washing liquid with filter paper impregnated with an iodine solution.

4. The cleaning apparatus according to claim 1, wherein the processor performs measurement of absorbance in a predetermined wavelength range on the washing liquid and determines whether or not the cleaning of the PVA sponge is completed by comparing a measurement value with a set value.

5. A cleaning apparatus performing cleaning treatment for a PVA sponge used for substrate washing by causing the PVA sponge to contact with a cleaning member while supplying a washing liquid to the PVA sponge, the cleaning apparatus comprising:
    a pump that extracts the washing liquid remaining in the PVA sponge or the washing liquid flowing out from the PVA sponge in the cleaning treatment;
    a reserving tank that generates a first reagent by adding a PVA cross-linking agent and an iodine solution to the washing liquid extracted by the pump and generates a second reagent by adding a starch degrading enzyme to the first reagent, and a processor that detects coloration degrees of iodine color reactions on the first reagent and the second reagent and determines whether or not the cleaning of the PVA sponge is completed based on the detected coloration degrees.

6. The cleaning apparatus according to claim 1, further comprising a camera that takes an image of the washing liquid subjected to the iodine color reaction, wherein the processor includes a learned model for generating a finish index that indicates an extent of finish of the cleaning treatment and detects the finish of the cleaning treatment in a case where the finish index obtained by inputting the taken image of the washing liquid subjected to the iodine color reaction to the learned model exceeds a predetermined value.

7. A substrate washing device comprising the cleaning apparatus according to claim 1, wherein the substrate washing device performs washing treatment on a substrate by using the PVA sponge on which washing treatment is performed by the cleaning apparatus.

\* \* \* \* \*